(12) United States Patent
Kim et al.

(10) Patent No.: US 10,476,003 B2
(45) Date of Patent: Nov. 12, 2019

(54) METHOD FOR FABRICATING DIVISION MASK

(71) Applicant: SAMSUNG DISPLAY CO., LTD., Yongin-si, Gyeonggi-do (KR)

(72) Inventors: Jongbum Kim, Yongin-si (KR); Sangmin Yi, Yongin-si (KR); Daewon Baek, Yongin-si (KR); Minchul Song, Yongin-si (KR); Sangshin Lee, Yongin-si (KR); Seungjin Lee, Yongin-si (KR); Jiyun Chun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 233 days.

(21) Appl. No.: 15/701,856

(22) Filed: Sep. 12, 2017

(65) Prior Publication Data

US 2018/0083193 A1    Mar. 22, 2018

(30) Foreign Application Priority Data

Sep. 22, 2016  (KR) .................. 10-2016-0121527

(51) Int. Cl.
| | |
|---|---|
| *B05C 11/11* | (2006.01) |
| *H01L 51/00* | (2006.01) |
| *H01L 21/00* | (2006.01) |
| *H01L 21/67* | (2006.01) |
| *C23C 14/04* | (2006.01) |
| *C23C 14/12* | (2006.01) |
| *H01L 51/56* | (2006.01) |

(52) U.S. Cl.
CPC ........ *H01L 51/0011* (2013.01); *C23C 14/042* (2013.01); *C23C 14/12* (2013.01); *H01L 21/00* (2013.01); *H01L 21/67* (2013.01); *H01L 51/001* (2013.01); *H01L 51/0002* (2013.01); *H01L 51/0014* (2013.01); *H01L 51/56* (2013.01)

(58) Field of Classification Search
CPC ... H01L 51/0011; H01L 51/001; H01L 51/56; H01L 51/0014; H01L 21/67; H01L 51/0002; C23C 14/12; C23C 14/042
See application file for complete search history.

(56) References Cited

U.S. PATENT DOCUMENTS

| | | | |
|---|---|---|---|
| 8,151,729 | B2 | 4/2012 | Ko |
| 9,343,708 | B2 | 5/2016 | Hong et al. |

(Continued)

FOREIGN PATENT DOCUMENTS

| | | |
|---|---|---|
| KR | 10-0840152 B1 | 6/2008 |
| KR | 10-0902448 B1 | 6/2009 |

(Continued)

*Primary Examiner* — Shouxiang Hu
(74) *Attorney, Agent, or Firm* — Lewis Roca Rothgerber Christie LLP

(57) ABSTRACT

A method of manufacturing a division mask includes pulling opposite end portions of a mask member in a first direction to fasten the mask member to a fastening portion, forming a first pattern portion having a plurality of first openings on the fastened mask member, such that the first pattern portion has a longer length in the first direction toward a central portion of the first pattern portion, and cutting the opposite end portions of the mask member to detach the mask member from the fastening portion.

10 Claims, 9 Drawing Sheets

(56) References Cited

U.S. PATENT DOCUMENTS

| | | | | |
|---|---|---|---|---|
| 2003/0101932 A1* | 6/2003 | Kang | ................... | C23C 14/042 |
| | | | | 118/504 |
| 2012/0240850 A1* | 9/2012 | Kobayashi | ............ | C23C 14/042 |
| | | | | 118/504 |
| 2013/0199443 A1* | 8/2013 | Kim | ....................... | B05B 12/20 |
| | | | | 118/504 |
| 2014/0230219 A1* | 8/2014 | Lee | ....................... | C23C 14/042 |
| | | | | 29/428 |
| 2016/0260935 A1* | 9/2016 | Lee | ....................... | C23C 14/042 |

FOREIGN PATENT DOCUMENTS

| | | | |
|---|---|---|---|
| KR | 10-2014-0070873 A | | 6/2014 |
| KR | 10-1450728 B1 | | 10/2014 |

\* cited by examiner

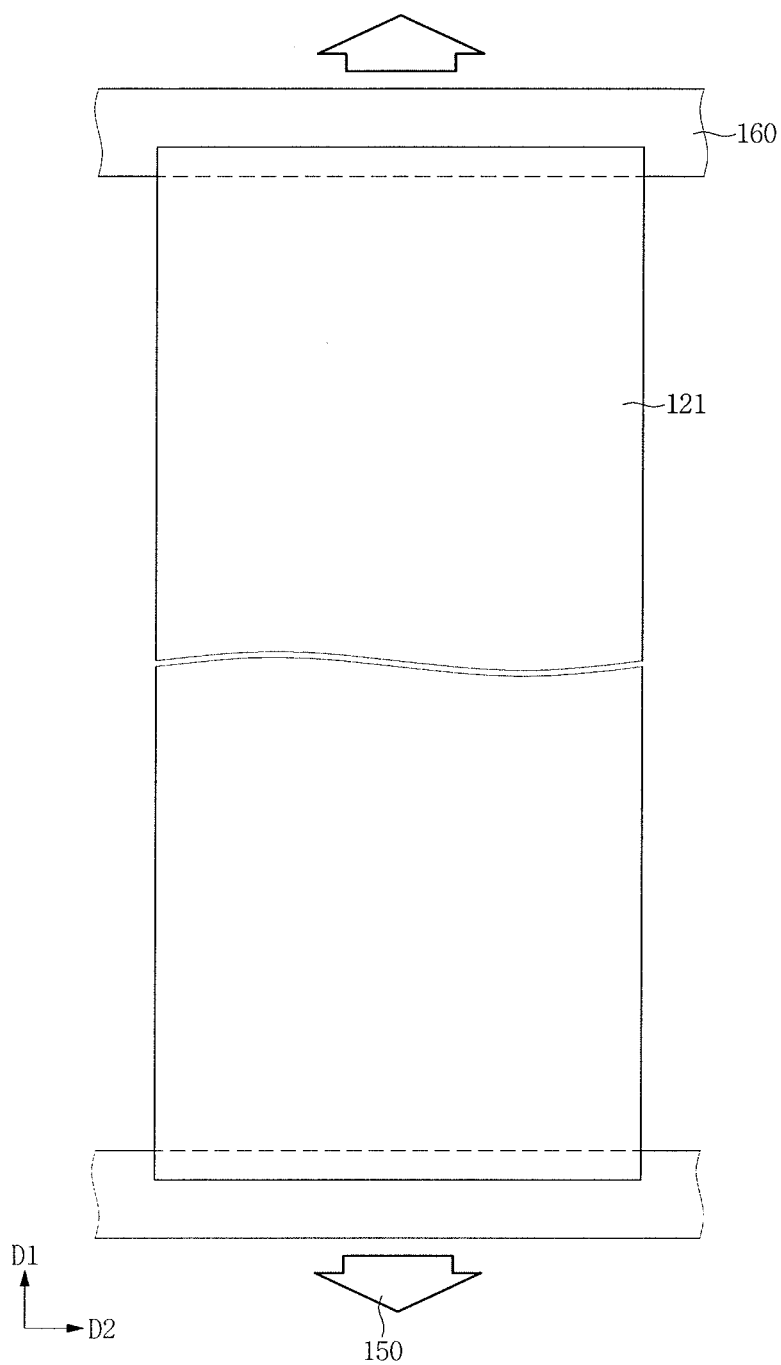

METHOD FOR FABRICATING DIVISION MASK

CROSS-REFERENCE TO RELATED APPLICATION

Korean Patent Application No. 10-2016-0121527, filed on Sep. 22, 2016, in the Korean Intellectual Property Office (KIPO), and entitled: "Method For Fabricating Division Mask," is incorporated by reference herein in its entirety.

BACKGROUND

1. Field

Exemplary embodiments relate to a method of manufacturing a division mask.

2. Description of the Related Art

Display devices may be classified into liquid crystal display ("LCD") devices, organic light emitting diode ("OLED") display devices, plasma display panel ("PDP") devices, electrophoretic display devices, and the like based on a light emitting scheme thereof. Among them, OLED display devices are excellent in display characteristics, e.g., a contrast ratio and response time, and attract attention as a next generation display device due to easy implementation of flexible display.

In general, an OLED display device has a structure in which a plurality of thin films, including an organic material, are surrounded by a cathode and an anode on a substrate. When voltage is applied to the cathode and the anode, a current is caused to flow, thus causing a light emitting phenomenon in an organic thin film. That is, organic molecules are excited by the current application, and then return to the original ground state to emit extra energy into light. As such, in order to form an OLED display device including a plurality of organic thin film layers, it is important to deposit an organic thin film having a uniform thickness throughout the substrate.

The organic thin film may be formed by a deposition process using a deposition mask. In general, a deposition mask is fastened to a frame having an opening so as to maintain rigidity, thereby constituting a deposition mask assembly. However, as the substrate on which the deposition is performed becomes large, the deposition mask may experience deflection.

SUMMARY

According to an exemplary embodiment, a method of manufacturing a division mask includes pulling opposite end portions of a mask member in a first direction to fasten the mask member to a fastening portion; forming a first pattern portion having a plurality of first openings on the mask member; and cutting the opposite end portions of the mask member to detach the mask member from the fastening portion. The first pattern portion has a longer length in the first direction toward a central portion of the first pattern portion.

An end portion of the first pattern portion may have a curved shape.

An end portion of the first pattern portion may have a step shape.

The mask member detached from the fastening portion may include a second pattern portion having a plurality of second openings.

The first pattern portion may have a longer length at a central portion of the first pattern portion than a length of the second pattern portion at a central portion of the second pattern portion.

The second pattern portion may have a substantially same length at a central portion of the second pattern portion as a length of an edge portion of the second pattern portion.

An end portion of the second pattern portion may have a straight line shape.

The mask member may include one of stainless steel (SUS), an invar alloy, nickel (Ni), cobalt (Co), a nickel alloy and a nickel-cobalt alloy.

The first pattern portion may be formed to have a narrower width, as farther away from opposite end portions of the mask member.

The opposite end portions of the mask member may be cut in a curved shape.

BRIEF DESCRIPTION OF THE DRAWINGS

Features will become apparent to those of skill in the art by describing in detail exemplary embodiments with reference to the attached drawings, in which:

FIGS. 2A, 2B, and 2C illustrate plan views of stages in a method of manufacturing a division mask according to an exemplary embodiment;

DETAILED DESCRIPTION

Figure 1:
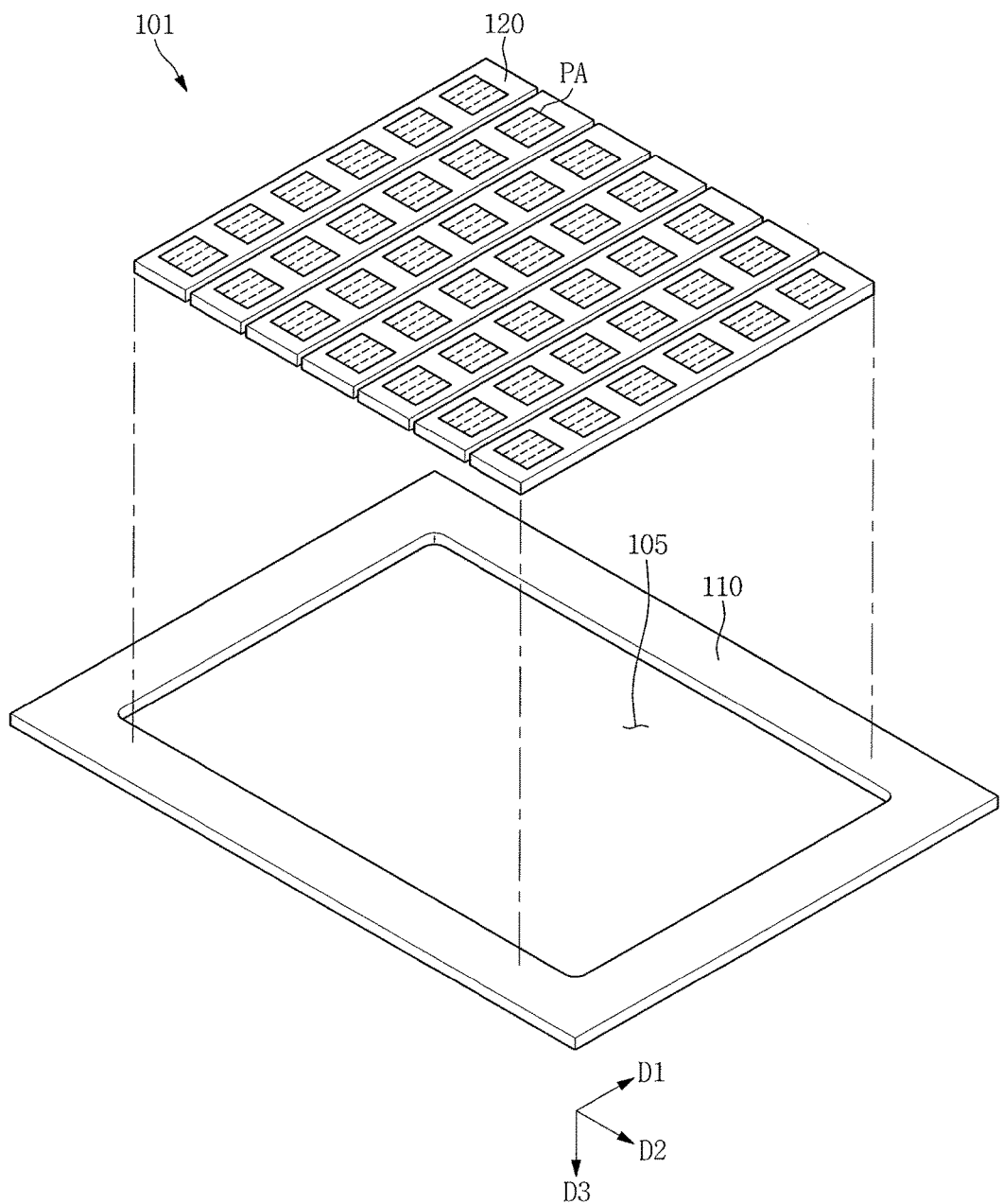
FIG. 1 illustrates an exploded perspective view of a deposition mask assembly according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

Unless otherwise defined, all terms used herein (including technical and scientific terms) have the same meaning as commonly understood by those skilled in the art. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe exemplary embodiments, and like reference numerals refer to like elements throughout the specification.

FIG. 1 is an exploded perspective view illustrating a deposition mask assembly 101 according to an exemplary embodiment.

Referring to FIG. 1, the deposition mask assembly 101 according to an exemplary embodiment may include a frame 110 and a plurality of division masks 120. Hereinafter, for ease of description, a short side direction of the frame 110 is referred to as a first direction D1, a long side direction of the frame 110 is referred to as a second direction D2, and a thickness direction of the frame 110 is referred to as a third direction D3.

The frame 110 has an opening area 105 at the center thereof. For example, as illustrated in FIG. 1, the frame 110 may have a quadrangular shape corresponding to a substrate which is a deposition object, and may have the opening area 105 of a quadrangular shape at the center thereof so as to perform a deposition process on the substrate.

The plurality of division masks 120 may be disposed on the frame 110 across the opening area 105. In such an exemplary embodiment, the plurality of division masks 120 may be fastened on the frame 110 while receiving a tensile force in the first direction D1, e.g., the plurality of division masks 120 may be stretched along the first direction D1 to be in a tensioned state along the first direction D1 while fastened to the frame 110. Accordingly, the frame 110 may receive a compressive force, which is a reaction to the tensile force, in the first direction D1. In addition, when the plurality of division masks 120 is welded to be fastened, the frame 110 may be deformed by heat. Accordingly, the frame 110 includes a metal having high rigidity in order to substantially minimize the compressive force acting on the frame 110 or the deformation due to heat.

The plurality of division masks 120 are continuously arranged along the second direction D2, and may be disposed apart from each other without overlapping each other. Opposite end portions of the plurality of division masks 120 overlap side portions of the frame 110 facing each other along the first direction D1, respectively, and the opposite end portions may be welded to the side portions of the frame 110 to be fastened.

For example, as illustrated in FIG. 1, the plurality of division masks 120 are arranged so as to cross the opening area 105 in the first direction D1, and opposite end portions of each division mask 120 are welded to the side portion of the frame 110. In such an exemplary embodiment, the welding may be spot welding. In the spot welding, deformation of the division mask 120 during welding may be significantly reduced by setting a plurality of welding points and welding them respectively. The welding point may be, for example, in the form of at least one column or zigzag.

The plurality of division masks 120 may include at least one of, e.g., stainless steel (SUS), an invar alloy, nickel (Ni), cobalt (Co), a nickel alloy, and a nickel-cobalt alloy.

The plurality of division masks 120 includes a pattern portion PA. That is, each of the plurality of division masks 120 includes a pattern portion PA at a portion overlapping the opening area 105. The pattern portion PA may include a plurality of openings to be described below. The plurality of openings may be defined, e.g., extend, completely through the division mask 120 in the third direction D3, which is the thickness direction of each of the division masks 120, or alternatively, only a part of the division masks 120 may be etched not to be penetrated completely. The plurality of openings may be formed into various shapes, e.g., a stripe shape and a dot shape according to the pattern of an organic thin film to be deposited on the display device.

As the deposition mask assembly 101 according to an exemplary embodiment includes the plurality of division masks 120, rather than including a single mask having a size corresponding to the opening area 105, the plurality of division masks 120 may be substantially prevented from being deformed due to the heat generated in the deposition process and a deflection phenomenon of the plurality of division masks 120 may be reduced.

Hereinafter, a method of manufacturing the division mask 120 according to exemplary embodiments will be described in detail with reference to FIGS. 2A, 2B, 2C, 3, 4A and 4B. Meanwhile, the mask member in FIGS. 2A, 2B, 2C, 3, 4A and 4B is not cut but is partially omitted due to lack of the ground.

Figure 2B:
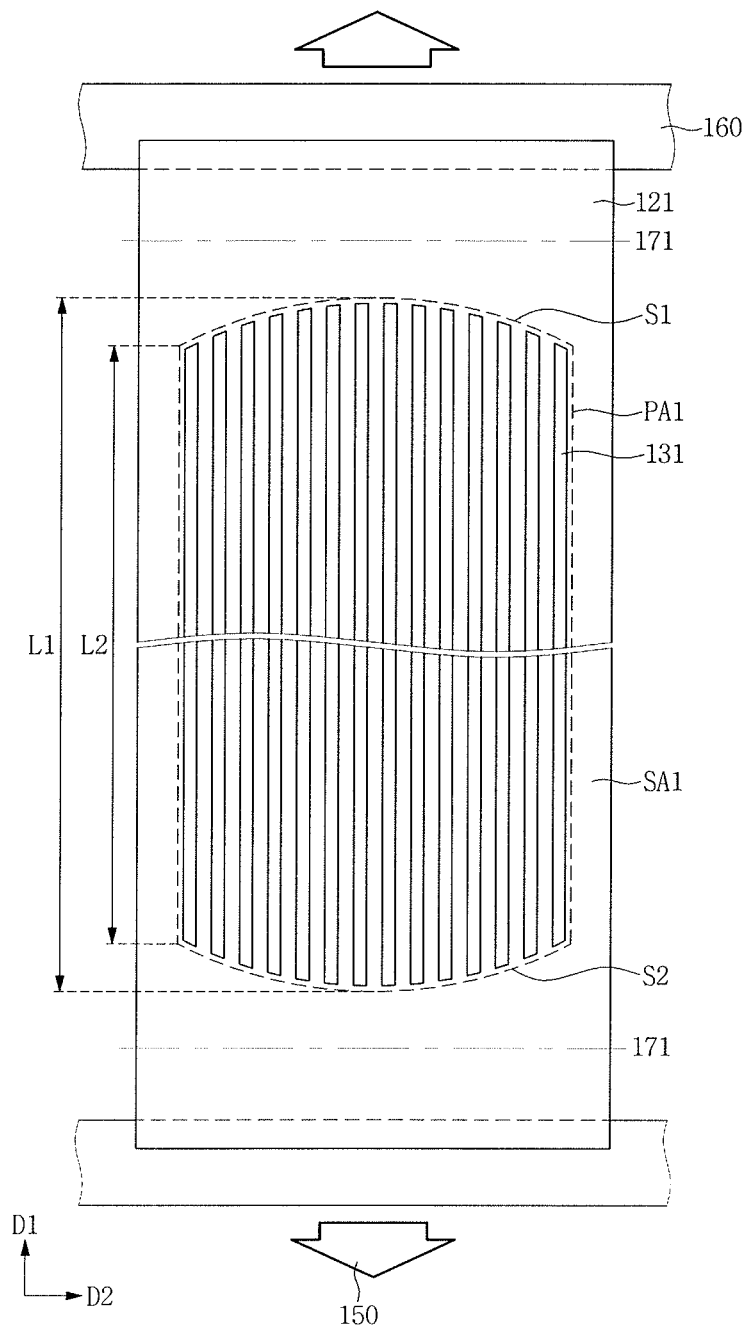
Figure 2C:
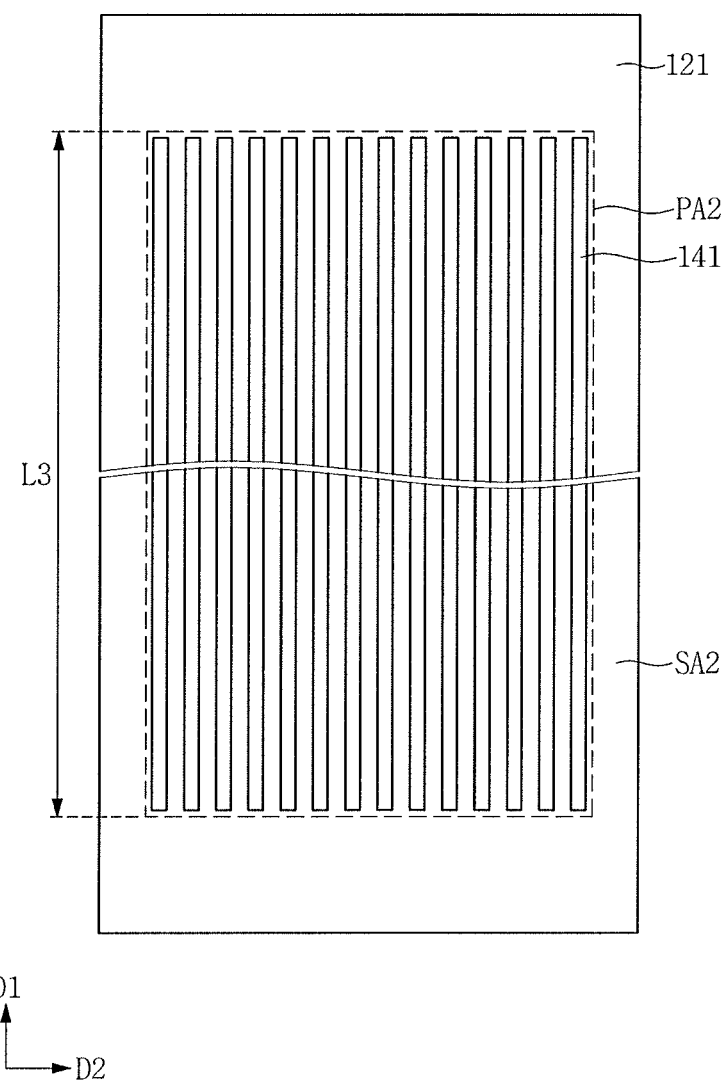

FIGS. 2A, 2B and 2C are plan views illustrating stages in a method of manufacturing the division mask 120 according to an exemplary embodiment.

FIG. 2A is a view illustrating that a mask member 121 is stretched and fastened in the first direction D1. Referring to FIG. 2A, the mask member 121 for manufacturing the division mask 120 is stretched along the first direction D1, which is a longitudinal direction of the division mask 120, and is fastened to a fastening portion 160. That is, a tensile force acts on the mask member 121 in a direction of an arrow 150, and opposite end portions of the stretched mask member 121 may be fastened to the fastening portion 160. In such an exemplary embodiment, a greater tensile force may act on a central portion of the mask member 121 than a tensile force acting on an edge portion of the mask member 121.

The mask member 121 may include at last one of, e.g., stainless steel (SUS), an invar alloy, nickel (Ni), cobalt (Co), a nickel alloy, and a nickel-cobalt alloy.

The fastening portion 160 may have a plate shape supporting opposite end portions of the mask member 121. For example, the fastening portion 160 may be any suitable support, e.g., a frame similar to frame 110, to support at least opposite edges of the mask member 121 during formation of the first pattern portion PA1 therethrough. In addition, the fastening portion may have a roll shape about which a part of opposite end portions of the mask member 121 is rolled. The roll-shaped fastening portion may rotate to adjust the position of the mask member 121.

FIG. 2B is a view illustrating that the first pattern portion PA1 having a plurality of first openings 131 is formed in the mask member 121. Referring to FIG. 2B, the mask member 121 includes the first pattern portion PA1 having the plurality of first openings 131 and a first surrounding area SA1 surrounding, e.g., an entire perimeter of, the first pattern portion PA1. For example, as illustrated in FIG. 2B, the first pattern portion PA1 and the plurality of first openings 131 therein may have longitudinal directions thereof extend along the first direction D1. In the drawings, the plurality of first openings 131 according to an exemplary embodiment are depicted as having a stripe shape, but exemplary embodiments are not limited thereto.

The plurality of first openings 131 may be defined, e.g., formed, through a photoetching method. For example, a photoresist may be applied to an entire surface of the mask member 121, and light, e.g., ultraviolet light, may be selectively irradiated through a mask to expose the photoresist. When the exposed photoresist is developed, a photoresist pattern having different thicknesses is formed. Subsequently, a part of the mask member 121 is removed using the photoresist pattern as a mask. In such an exemplary embodiment, portions of the mask member 121 may be removed by a wet etching method using an etching solution. A part of the mask member 121 is etched to form the first pattern portion PA1 having the plurality of first openings 131. However, exemplary embodiments are not limited thereto, and the first pattern portion PA1 having the plurality of first openings 131 may be formed through various methods.

The first pattern portion PA1 according to an exemplary embodiment is formed to have a longer length in the first direction D1 toward a central portion thereof. For example, as illustrated in FIG. 2B, when a length of the first pattern portion PA1 at a central portion, e.g., along the second direction D2, is defined as a first length L1 and a length of the first pattern portion PA1 at an edge portion is defined as a second length L2, the first length L1 is longer than the second length L2. In other words, lengths of first openings 131 of the plurality of first openings 131 along the first direction D1 in the center of the first pattern portion PA1 (with the center being determined along the second direction D2) may be longer than lengths of first openings 131 of the plurality of first openings 131 at edges of the first pattern portion PA1, e.g., the length L1 may be gradually reduced to reach the length L2.

In addition, an end portion of the first pattern portion PA1 may have a curved shape, e.g., opposite end portions of each of the first openings 131 in the first pattern portion PA1 that are spaced apart from each other along the first direction D1 may be curved to protrude in opposite directions along the first direction D1. For example, when opposite end portions of the first pattern portion PA1 facing each other along the first direction D1 are defined as a first end portion S1 and a second end portion S2, respectively, the first end portion S1 and the second end portion S2 may have a curved shape symmetric to each other, e.g., with respect to a symmetry axis along the first direction D1 and/or with respect to a symmetry axis along the second direction D2. However, a shape of the first pattern portion PA1 having the plurality of first openings 131 is not limited thereto, and may be variously modified in consideration of the magnitude of the tensile force according to the position of the mask member 121.

Subsequently, the mask member 121 is cut along a cutting line 171 at the first surrounding area SA1. Although the cutting line 171 according to an exemplary embodiment is depicted as having a linear shape, exemplary embodiments are not limited thereto. The cutting line 171 may be formed into various shapes, e.g., a curved shape, a Y-like shape, and the like.

FIG. 2C is a view illustrating the mask member 121 detached from the fastening portion. Referring to FIGS. 2B and 2C, the mask member 121 is cut along the cutting line 171 at the first surrounding area SA1 to be detached from the fastening portion. Accordingly, as the mask member 121 is detached from the fastening portion, the tensile force acting on the mask member 121 is removed, e.g., without the tensile force the mask member 121 may return to its unstretched shape.

The mask member 121, from which the tensile force is removed, includes a second pattern portion PA2 having a plurality of second openings 141 and a second surrounding area SA2 surrounding the second pattern portion PA2. That is, as the tensile force acting on the mask member 121 is removed, the shape of the mask member 121 may change, e.g., as compared to a tensioned mask member 121. In other words, due to the tensile force removal, the shape of the plurality of the first openings 131 (which were tensioned with the mask member 121) may be deformed such that an overall length of the pattern portion may be reduced to define the second pattern portion PA2 having the plurality of second openings 141. For example, when a length of the second pattern portion PA2 at a central portion is defined as a third length L3, the third length L3 is less than each of the first length L1 and the second length L2 of the first pattern portion PA1 before the tensile force is removed.

In addition, as described above, the tensile force acting on the mask member 121 is greater at a central portion than at an edge portion, and when the tensile force is removed, the length of the pattern portion may be reduced more at the central portion than at the edge portion. In such an exemplary embodiment, since the first length L1 of the first pattern unit PA1 is longer than the second length L2 thereof, the second pattern portion PA2 of the mask member 121, from which the tensile force is removed, may have a substantially same length at the central portion and at the edge portion. For example, as illustrated in FIG. 2C, the second pattern portion PA2 may have the third length L3 regardless of a distance from the central portion. That is, an end portion of the second pattern portion PA2 may have a straight line shape, e.g., as compared to the curved first and second portions S1 and S2.

Then, an additional process may be further performed as necessary, and the plurality of division masks 120 may be manufactured through a manufacturing method described above.

The method of manufacturing the division mask 120 according to an exemplary embodiment forms the first pattern portion PA1, on the mask member 121, having a longer length toward the central portion in consideration of deformation during the manufacturing process of the plurality of openings that differs depending on the position. Accordingly, the difference between the opening shape of the designed division mask and the opening shape of the manufactured division mask may be substantially minimized.

Figure 3:
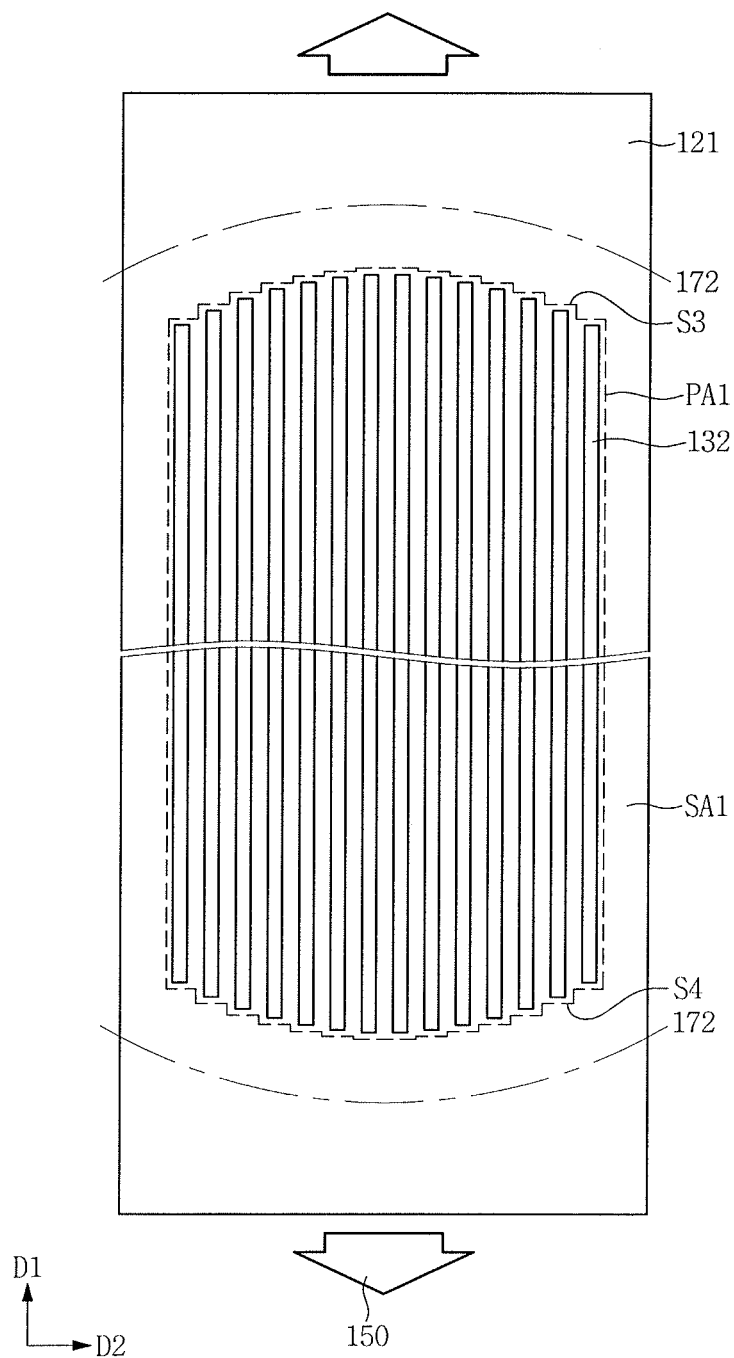
FIG. 3 illustrates a plan view of a stage in a method of manufacturing a division mask according to an alternative exemplary embodiment.

FIG. 3 is a plan view illustrating a method of manufacturing a division mask according to an alternative exemplary embodiment. The description of the same configuration as that of the previously described exemplary embodiment will be omitted for convenience of explanation.

For example, FIG. 3 is a view illustrating that a tensile force acts on the mask member 121 in a direction of the arrow 150 and a first pattern portion PA1 having a plurality of first openings 132 is formed on the mask member 121 which is stretched. Referring to FIG. 3, the mask member 121 includes the first pattern portion PA1 having the plurality of first openings 132 and a first surrounding area SA1 surrounding the first pattern portion PA1.

The first pattern portion PA1 is formed to have a length in the first direction D1 that is longer toward a central portion. In such an exemplary embodiment, an end portion of the first pattern portion PA1 according to an alternative exemplary embodiment may have a step shape. For example, when opposite end portions of the first pattern portion PA1 facing each other along the first direction D1 are defined as a third end portion S3 and a fourth end portion S4, respectively, the third end portion S3 and the fourth end portion S4 may have a step shape symmetric to each other.

Subsequently, the mask member 121 is cut along a cutting line 172 at the first surrounding area SA1. The cutting line 172 according to an alternative exemplary embodiment has a curved shape. Accordingly, a length between opposite ends of the mask member 121 from which the tensile force is removed may have a substantially same length in the first direction D1.

Figure 4A:
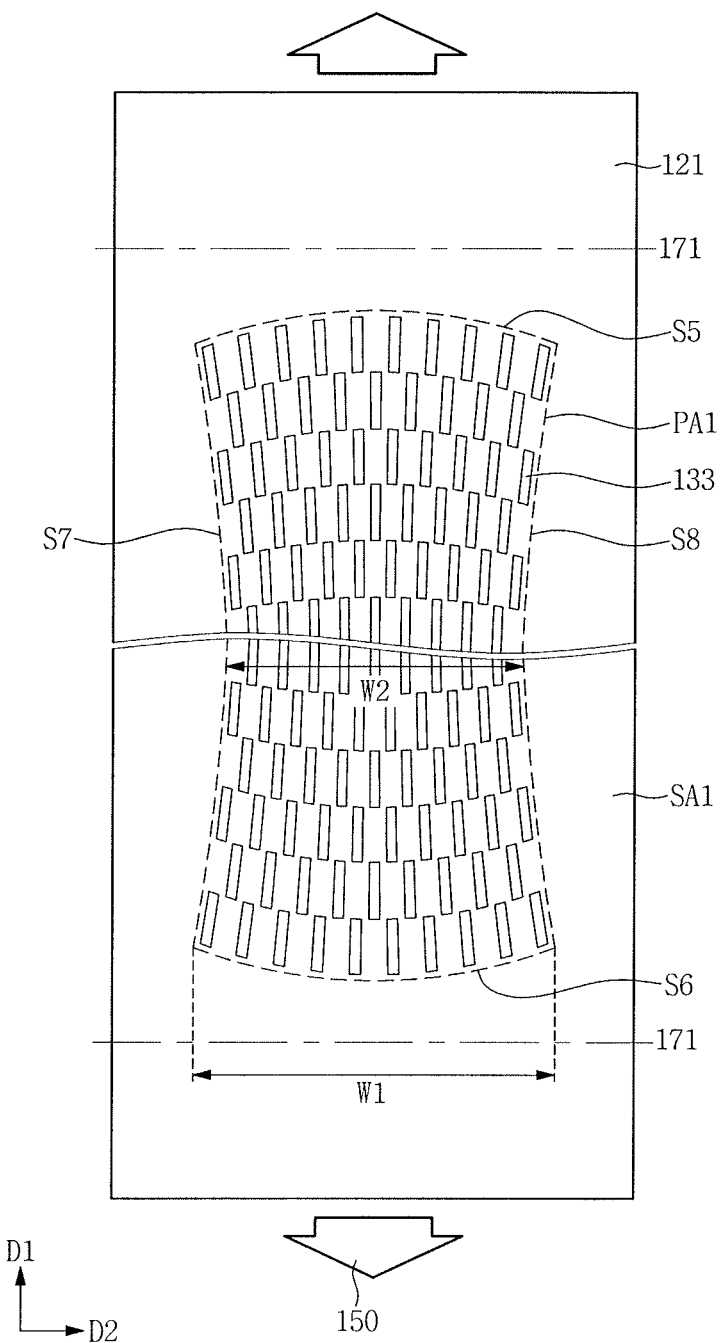
FIGS. 4A and 4B illustrate plan views of stages in a method of manufacturing a division mask according to another alternative exemplary embodiment.
Figure 4B:
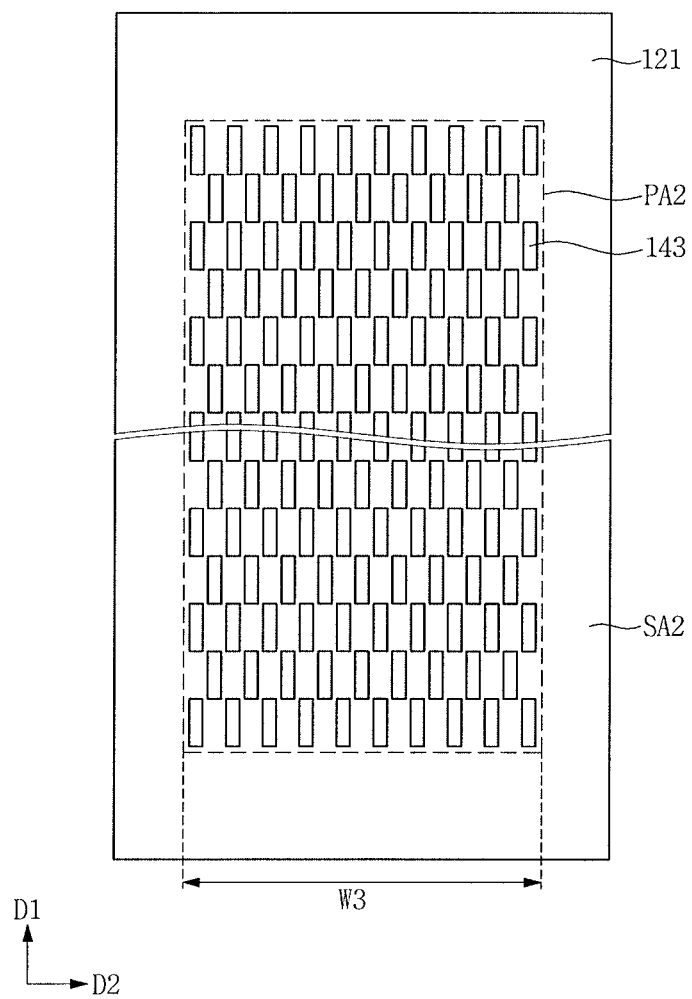

FIGS. 4A and 4B are plan views illustrating a method of manufacturing a division mask according to another alternative exemplary embodiment. The description of the same configuration as that of the previously described exemplary embodiments will be omitted for convenience of explanation.

FIG. 4A is a view illustrating that a tensile force acts on the mask member 121 in a direction of the arrow 150 and a first pattern portion PA1 having a plurality of first openings 133 is formed on the mask member 121 which is stretched. In such an exemplary embodiment, a greater tensile force may act on a central portion of the mask member 121 than a tensile force acting on an edge portion of the mask member 121. Further, a greater tensile force may act on the mask member 121, as farther away from the opposite ends. Referring to FIG. 4A, the mask member 121 includes the first pattern portion PA1 having the plurality of first openings 133 and a first surrounding area SA1 surrounding the first pattern portion PA1. The plurality of first openings 133 according to another alternative exemplary embodiment may have a dot shape, and the plurality of first openings 133 may be arranged in a zigzag shape.

The first pattern portion PA1 is formed to have a longer length in the first direction D1 toward a central portion thereof. In addition, the first pattern portion PA1 according to another alternative exemplary embodiment is formed to have a narrower width, as farther from opposite ends thereof. For example, as illustrated in FIG. 4A, when a width of the first pattern portion PA1 at the opposite ends is defined as a first width W1 and a width of the first pattern portion PA1 at a position distanced from the opposite ends is defined as a second width W2, the first width W1 is greater than the second width W2.

In addition, all end portions of the first pattern portion PA1 may have a curved shape. For example, when opposite end portions of the first pattern portion PA1 facing each other along the first direction D1 are defined as a fifth end portion S5 and a sixth end portion S6, respectively, and opposite end portions of the first pattern portion PA1 facing each other along the second direction D2 are defined as a seventh end portion S7 and an eighth end portion S8, respectively, the fifth, sixth, seventh and eighth end portions S5, S6, S7 and S8 may have a curved shape.

FIG. 4B is a view illustrating the mask member 121 detached from the fastening portion. Referring to FIGS. 4A and 4B, the mask member 121 is cut along the cutting line 171 at the first surrounding area SA1 to be detached from the fastening portion, and accordingly, a tensile force acting on the mask member 121 is removed.

The mask member 121 from which the tensile force is removed includes the second pattern portion PA2 having a plurality of second openings 143 and the second surrounding area SA2 surrounding the second pattern portion PA2.

As the tensile force acting on the mask member 121 is removed, the shape of the plurality of openings may be deformed, and accordingly, an overall length of the pattern portion may be reduced. In addition, as the tensile force acting on the mask member 121 according to an alternative exemplary embodiment is removed, an overall width of the pattern portion may increase. For example, when a width of the second pattern portion PA2 at opposite ends is defined as a third width W3, the third width W3 is greater than the first width W1 and the second width W2 of the first pattern portion PA1 before the tensile force is removed.

In addition, as described above, the tensile force acting on the mask member 121 is greater as farther away from the opposite ends, and when the tensile force is removed, the width of the pattern portion may increase more, as farther away from the opposite ends. In such an exemplary embodiment, since the first width W1 of the first pattern portion PA1 is longer than the second width W2 thereof, the second pattern portion PA2 of the mask member 121, from which the tensile force is removed, may have a substantially same width regardless of a distance from the opposite ends. For example, as illustrated in FIG. 2C, the second pattern portion PA2 may have the third width W3 regardless of the distance from the opposite ends.

The method of manufacturing the division mask 120 according to another alternative exemplary embodiment forms the first pattern portion PA1, on the mask member 121, having a longer length toward the central portion and a less width as farther away from the opposite ends of the mask member 121 such that the difference between the opening shape of the designed division mask and the opening shape of the manufactured division mask may be substantially minimized.

Hereinafter, with reference to FIG. 5, a deposition process of a display device using a deposition mask assembly according to an exemplary embodiment will be described in detail.

Figure 5:
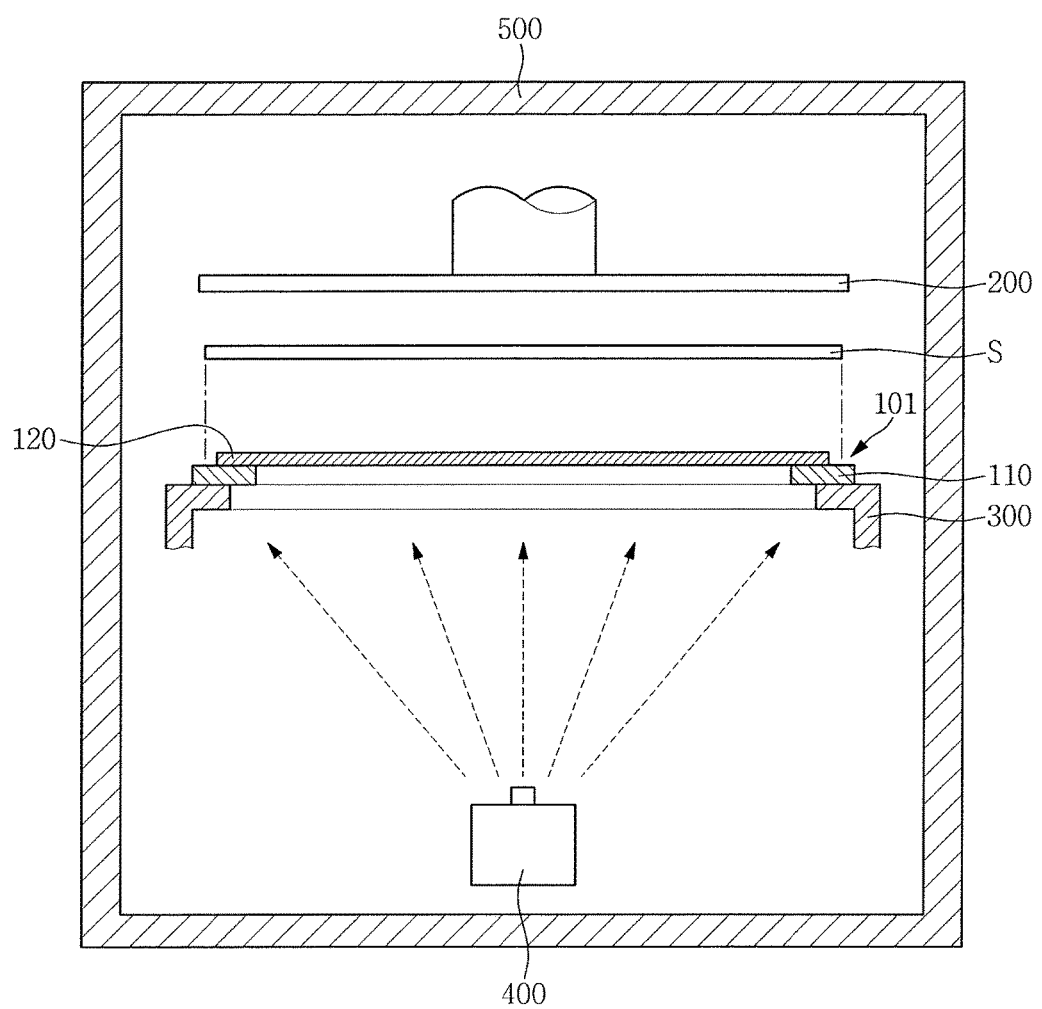
FIG. 5 illustrates a cross-sectional view of a deposition process of a display device using a deposition mask assembly according to an exemplary embodiment.

FIG. 5 is a cross-sectional view illustrating a deposition process of a display device using a deposition mask assembly according to an exemplary embodiment.

Referring to FIG. 5, the deposition process apparatus according to an exemplary embodiment includes the deposition mask assembly 101, a magnet unit 200, a fastening member 300, an evaporation source 400, and a chamber 500.

The deposition mask assembly 101 may include the frame 110 and the division mask 120, and is positioned in the chamber 500 and at an upper portion of the chamber 500 so as to face the evaporation source 400.

The magnet unit 200, e.g., a magnet support, is positioned to oppose the deposition mask assembly 101 with a substrate S which is a deposition object interposed therebetween. The division mask 120 of the deposition mask assembly 101 may be brought into close contact with the substrate S through a magnetic force from the magnet unit 200.

The fastening member 300 supports an edge portion of the deposition mask assembly 101. The fastening member 300 is disposed outside a movement path of an organic material supplied from the evaporation source 400 to the substrate S.

The evaporation source 400 is positioned below the deposition mask assembly 101 and supplies an organic material to the substrate S through the pattern portion PA of the division mask 120. That is, the organic material is supplied toward a deposition surface of the substrate S positioned in the chamber 500 and at an upper portion of the chamber 500.

The evaporation source 400 may be in the form of a crucible containing the organic material therein, and may evaporate the organic material with heat to be deposited on the substrate S. The deposition process apparatus may further include a heater for heating the organic material. The heater is provided on opposite sides of the evaporation source 400 to heat the evaporation source 400 so that the organic material contained in the evaporation source 400 may be heated and sublimated.

The chamber 500 provides a space in which the deposition process may proceed. The chamber 500 may be connected to a vacuum pump, e.g., a turbo molecular pump (TMP), to maintain the inside of the chamber 500 in a vacuum state during the deposition process. The chamber 500 may further include an anti-adhesion plate disposed to surround an inner wall surface. The anti-adhesion plate substantially prevents the organic material that is not deposited on the substrate S among the organic materials ejected from the evaporation source 400 from being adsorbed on the inner wall surface of the chamber 500.

The substrate S may be positioned above the deposition mask assembly 101. The substrate S may be disposed to overlap the opening area 105 of the deposition mask assembly 101. In addition, the substrate S may be spaced apart from an upper portion of the deposition mask assembly 101 by a predetermined distance.

Although not illustrated, the deposition process apparatus may further include a thickness monitoring sensor for measuring a velocity of an evaporating organic material, a thickness controller for controlling the evaporation source 400 according to the measured thickness, a shutter for blocking the organic material evaporated from the evaporation source 400, or the like. In addition, the deposition process apparatus may further include an aligner and a CCD camera disposed outside the chamber 500 to align the substrate S and the deposition mask assembly 101.

A process of depositing the deposition material on the deposition surface of the substrate S will be briefly described below.

First, the deposition mask assembly 101 is fastened to the fastening member 300, and the substrate S is disposed above the division mask 120. Then, the evaporation source 400 in the chamber 500 and at a lower portion of the chamber 500 sprays the organic material toward the deposition mask assembly 101. For example, when a power is applied to the heater connected to the evaporation source 400, the evaporation source 400 containing the organic material is heated, and accordingly, the organic material is heated and sublimated to be sprayed toward the deposition mask assembly 101. In such a case, the inside of the chamber 500 is maintained at a high degree of vacuum and a high temperature.

When the organic material is sprayed, the organic material is deposited on the deposition surface of the substrate S by the pattern portion PA formed in the division mask 120. By repeating this process, a multilayer organic thin film may be formed on the substrate S.

As the size of the display device becomes larger, the size of the vacuum deposition apparatus itself becomes larger, and the size of the deposition mask assembly 101 also becomes larger. Accordingly, warping and deflection phenomenon of the mask may potentially occur. However, the deposition mask assembly 101 according to an exemplary embodiment includes the plurality of the division masks 120 to substantially minimize the warping and deflection phenomenon, thereby substantially preventing degradation in deposition precision and uniformity of the organic thin film on the substrate S. Accordingly, the lifetime and reliability of the display device may be improved.

Hereinafter, an organic light emitting diode ("OLED") display device manufactured using a deposition mask assembly according to an exemplary embodiment will be described in detail with reference to FIG. 6.

Figure 6:
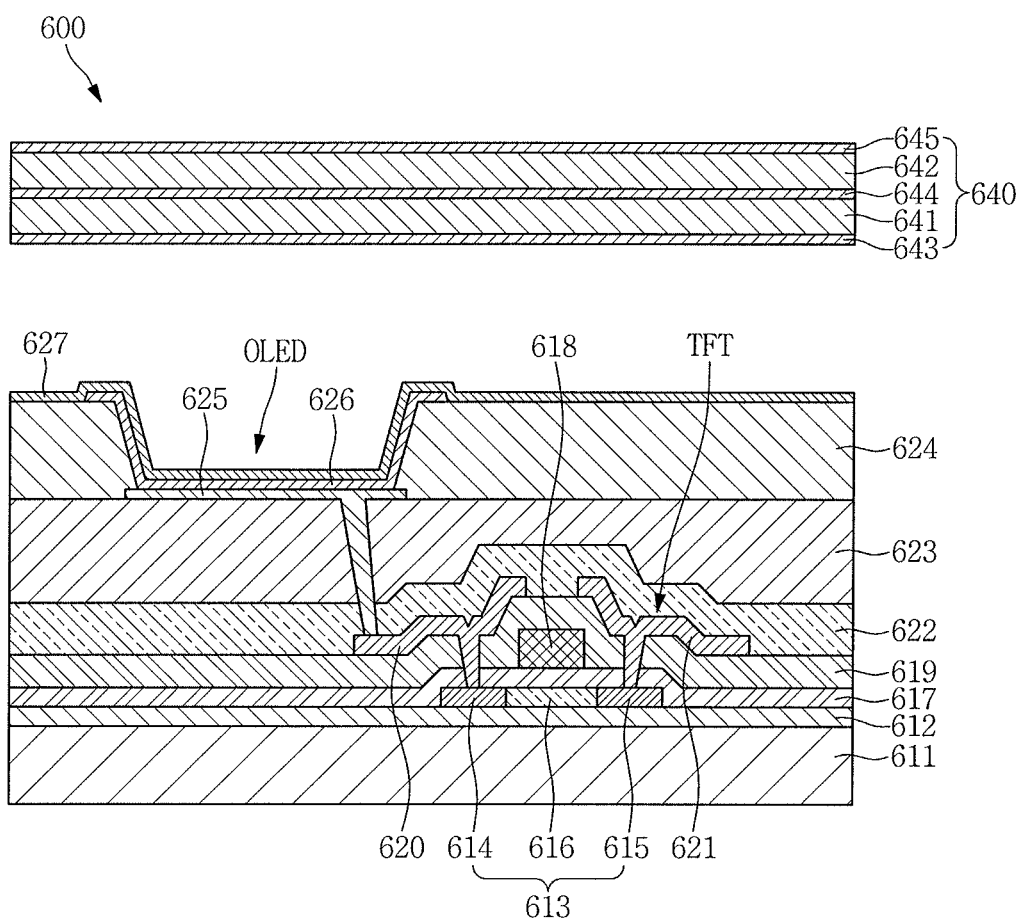
FIG. 6 illustrates a cross-sectional view of an organic light emitting diode ("OLED") display device manufactured using a deposition mask assembly according to an exemplary embodiment.

FIG. 6 is a cross-sectional view illustrating an OLED display device manufactured using the deposition mask assembly 101 according to an exemplary embodiment.

Referring to FIG. 6, the OLED display device 600 includes a base substrate 611, a barrier layer 612, a semiconductor active layer 613, a gate insulating layer 617, an insulating interlayer 619, a source electrode 620, a drain electrode 621, a passivation layer 622, a planarization layer 623, a pixel defining layer 624, an OLED and an encapsulation portion 640.

The base substrate 611 may include an insulating material having flexibility. For example, the base substrate 611 may include a polymer material, e.g., polyimide (PI), polycarbonate (PC), polyethersulphone (PES), polyethylene terephthalate (PET), polyethylene naphthalate (PEN), polyarylate (PAR), fiber glass reinforced plastic (FRP), and the like. Alternatively, the base substrate 611 may be a glass substrate. The base substrate 611 may be transparent, translucent, or opaque.

The barrier layer 612 is disposed on the base substrate 611. The barrier layer 612 may be disposed so as to cover an entire upper surface of the base substrate 611. The barrier layer 612 may include an inorganic layer or an organic layer. The barrier layer 612 may include a single film or a multilayer film. For example, the barrier layer 612 may include at least one of an inorganic material, e.g., silicon oxide ($SiOx$), silicon nitride ($SiN_x$), silicon oxynitride (SiON), aluminum oxide (AlO) and aluminum nitride (AlON), and an organic material, e.g., acryl, polyimide and polyester.

The barrier layer 612 serves to block oxygen and moisture, prevent diffusion of moisture or impurities through the base substrate 611 and provide a flat surface on the top of the base substrate 611. A thin film transistor ("TFT") is formed on the barrier layer 612. Although a top gate type TFT is illustrated as the TFT according to an exemplary embodiment, exemplary embodiments are not limited thereto, and the TFT of another structure, e.g., a bottom gate type TFT, may be used as the TFT according to an exemplary embodiment.

The semiconductor active layer 613 is disposed on the barrier layer 612. The semiconductor active layer 613 includes a source area 614, a drain area 615, and a channel area 616. The semiconductor active layer 613 is doped with N-type impurity ions or P-type impurity ions to form the source area 614 and the drain area 615. An area between the source area 614 and the drain area 615 is the channel area 616 where no impurity is doped.

The semiconductor active layer 613 may include polysilicon or amorphous silicon. In addition, the semiconductor active layer 613 may include an oxide semiconductor. For example, the oxide semiconductor may include an oxide of a material selected from group 4, 12, 13 or 14 metal elements, e.g., zinc (Zn), indium (In), gallium (Ga), tin (Sn), cadmium (Cd), germanium (Ge) and hafnium (Hf), and combinations thereof.

The gate insulating layer 617 is disposed on the semiconductor active layer 613. The gate insulating layer 617 may include an inorganic layer such as silicon oxide, silicon nitride or a metal oxide. The gate insulating layer 617 may have a single layer or multilayer structure.

A gate electrode 618 is disposed on the gate insulating layer 617. The gate electrode 618 may have a single layer or multilayer structure including, e.g., Au, Ag, Cu, Ni, Pt, Pd, Al, Mo or Cr or an alloy such as Al:Nd and Mo:W.

The insulating interlayer 619 is disposed on the gate electrode 618. The insulating interlayer 619 may include an insulating material, e.g., silicon oxide and silicon nitride. Further, the insulating interlayer 619 may include an insulating organic layer.

The source electrode 620 and the drain electrode 621 are disposed on the insulating interlayer 619. For example, a contact hole is defined in the gate insulating layer 617 and the insulating interlayer 619 by removing a part of them, the source area 614 and the source electrode 620 may be electrically connected to each other through the contact hole, and the drain area 615 and the drain electrode 621 may be electrically connected to each other through the contact hole.

The passivation layer 622 is disposed on the source electrode 620 and the drain electrode 621. The passivation layer 622 may include an inorganic layer, e.g., silicon oxide and silicon nitride or an organic layer.

The planarization layer 623 is disposed on the passivation layer 622. The planarization layer 623 may include an organic layer, e.g., acryl, polyimide and benzocyclobutene (BCB).

An OLED may be formed on the TFT. The OLED includes a first electrode 625, a second electrode 627 and an intermediate layer 626 between the first electrode 625 and the second electrode 627.

The first electrode 625 is electrically connected to one of the source electrode 620 and the drain electrode 621 through the contact hole. The first electrode 625 corresponds to a pixel electrode.

The first electrode 625 functions as an anode, and may include various conductive materials. The first electrode 625 may be a transparent electrode or may be a reflective electrode. For example, in the case where the first electrode 625 is a transparent electrode, the first electrode 625 may include, e.g., ITO, IZO, ZnO and $In_2O_3$. In the case where the first electrode 625 is a reflective electrode, the first electrode 625 may include a reflective layer including, e.g., Ag, Mg, Al, Pt, Pd, Au, Ni, Nd, Ir and Cr, and ITO, IZO, ZnO, $In_2O_3$, or the like may be formed on the reflective layer.

The pixel defining layer ("PDL") 624 is disposed on the planarization layer 623 to cover an edge of the first electrode 625. The pixel defining layer 624 defines a light emitting area of each sub-pixel by surrounding the edge of the first electrode 625.

The pixel defining layer 624 includes an organic material or an inorganic material. For example, the pixel defining layer 624 may include an organic material, e.g., polyimide, polyamide, benzocyclobutene, an acrylic resin and a phenol resin, or an inorganic material such as $SiN_x$. The pixel defining layer 624 may have a single layer or multilayer structure.

The intermediate layer 626 is disposed on the first electrode 625. The intermediate layer 626 may be disposed at an area exposed by etching a part of the pixel defining layer 624. The intermediate layer 626 may be made by a deposition process.

The intermediate layer 626 may include a low molecular organic material or a high molecular organic material. The intermediate layer 626 may include an organic emissive layer (EML). In addition, the intermediate layer 626 may include an organic emissive layer, and may further include at least one of a hole injection layer (HIL), a hole transport layer (HTL), an electron transport layer (ETL) and an electron injection layer (EIL). However, exemplary embodiments are not limited thereto, and the intermediate layer 626 may include an organic emissive layer, and may further include various other functional layers.

The second electrode 627 is disposed on the intermediate layer 626. The second electrode 627 corresponds to a common electrode. The second electrode 627 may be a transparent electrode.

The first electrode 625 may be disposed to have a shape corresponding to an opening of each pixel defining layer 624. On the other hand, the second electrode 627 may be deposited over an entire surface of the base substrate 611. Alternatively, the second electrode 627 may have a specific pattern instead of the deposition over the entire surface. The first electrode 625 and the second electrode 627 may be stacked with inverted position.

In an exemplary embodiment, the first electrode 625 and the second electrode 627 are insulated from each other by the intermediate layer 626. When a voltage is applied to the first electrode 625 and the second electrode 627, visible light is emitted from the intermediate layer 626 to realize an image that users may recognize.

The encapsulation portion 640 is disposed on the OLED. The encapsulation portion 640 protects the intermediate layer 626 and other thin films from external moisture, oxygen, or the like.

The encapsulation portion 640 may have a structure in which at least one organic layer and at least one inorganic layer are stacked. For example, the encapsulation portion 640 may have a stack structure including at least one organic layer 641 and 642 including, for example, epoxy, polyimide, polyethylene terephthalate, polycarbonate, polyethylene and polyacrylate, and at least one inorganic layer 643, 644 and 645 including, for example, silicon oxide ($SiO_2$), silicon nitride ($SiN_x$), aluminum oxide ($Al_2O_3$), titanium oxide ($TiO_2$), zirconium oxide ($ZrO_x$) and zinc oxide ($ZnO$).

The encapsulation portion 640 may have a structure including at least one organic layer 641 and 642 and at least two inorganic layers 643, 644 and 645. An uppermost layer 645 of the encapsulation portion 640 exposed to the outside may include an inorganic layer so as to substantially prevent moisture permeation to the OLED.

By way of summation and review, a mask frame assembly may include a plurality of stick-shaped division masks attached to a frame, and each division mask may include a plurality of openings therethrough for deposition. When forming the plurality of openings in the division mask, a tensile force acts on opposite end portions of the division mask. Accordingly, when the tensile force acting on the division mask is removed, after the opening is defined, the opening shape of the division mask may be deformed.

In contrast, exemplary embodiments are directed to a method of manufacturing a division mask that may substantially minimize a difference between an opening shape of a designed division mask and an opening shape of a manufactured division mask. For example, according to the exemplary method of manufacturing a division mask, the shape of the openings formed in the tensioned mask are intentionally formed to be longer at the center portion of the mask than at edges thereof (due to larger tension at the center portion than edges thereof), so the openings within the contracted mask (after removal of tension) contract within the contracted mask to have a substantially same length regardless of distance from the center portion.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a division mask, the method comprising:
    pulling opposite end portions of a mask member in a first direction to fasten the mask member to a fastening portion;
    forming a first pattern portion having a plurality of first openings on the fastened mask member, such that a length of the first pattern portion in the first direction becomes longer from an edge portion toward a central portion of the first pattern portion along a second direction perpendicular to the first direction; and
    cutting the opposite end portions of the mask member to detach the mask member from the fastening portion.

2. The method as claimed in claim 1, wherein forming the first pattern portion includes forming an end portion of the first pattern portion with a curved shape.

3. The method as claimed in claim 1, wherein forming the first pattern portion includes forming an end portion of the first pattern portion with a step shape.

4. The method as claimed in claim 1, wherein, when the mask member is detached from the fastening portion, the first pattern portion transforms into a second pattern portion having a plurality of second openings.

5. The method as claimed in claim 4, wherein the first pattern portion has a longer length at the central portion of the first pattern portion than a length of the second pattern portion at a central portion of the second pattern portion.

6. The method as claimed in claim 4, wherein the second pattern portion has a substantially same length at a central portion of the second pattern portion as a length of an edge portion of the second pattern portion.

7. The method as claimed in claim 4, wherein an end portion of the second pattern portion has a straight line shape.

8. The method as claimed in claim 1, wherein the mask member is formed of at least one of stainless steel (SUS), an invar alloy, nickel (Ni), cobalt (Co), a nickel alloy and a nickel-cobalt alloy.

9. The method as claimed in claim 1, wherein forming the first pattern portion includes forming the first pattern portion to have a narrower width, as farther away from the opposite end portions of the mask member.

10. The method as claimed in claim 1, wherein cutting the opposite end portions of the mask member includes making the cuts in a curved shape.

* * * * *